(12) United States Patent
Gullapalli et al.

(10) Patent No.: US 9,135,383 B2
(45) Date of Patent: Sep. 15, 2015

(54) TABLE MODEL CIRCUIT SIMULATION ACCELERATION USING MODEL CACHING

(71) Applicants: Kiran Gullapalli, Austin, TX (US); Steven D. Hamm, Austin, TX (US)

(72) Inventors: Kiran Gullapalli, Austin, TX (US); Steven D. Hamm, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 351 days.

(21) Appl. No.: 13/678,789

(22) Filed: Nov. 16, 2012

(65) Prior Publication Data

US 2014/0142903 A1    May 22, 2014

(51) Int. Cl.
*G06F 17/50* (2006.01)

(52) U.S. Cl.
CPC ........ *G06F 17/5022* (2013.01); *G06F 17/5036* (2013.01)

(58) Field of Classification Search
USPC ................................................. 703/2, 15, 22
See application file for complete search history.

(56) References Cited

U.S. PATENT DOCUMENTS

| | | | |
|---|---|---|---|
| 5,774,386 A | 6/1998 | Pawle | |
| 6,628,277 B1 * | 9/2003 | Deering et al. | 345/419 |
| 6,876,655 B1 * | 4/2005 | Afek et al. | 370/392 |
| 7,266,479 B2 | 9/2007 | Yang et al. | |
| 7,454,592 B1 | 11/2008 | Shah et al. | |
| 7,493,575 B2 | 2/2009 | Fang | |
| 7,900,173 B1 * | 3/2011 | Kuehlmann et al. | 716/107 |
| 2004/0260523 A1 * | 12/2004 | Yang et al. | 703/2 |
| 2007/0157135 A1 * | 7/2007 | Yang | 716/4 |

OTHER PUBLICATIONS

Fang, G. Peter et al.; "Fast, Accurate MOS Table Model for Circuit Simulation Using an Unstructured Grid and Preserving Monotonicity"; ASPDAC; 2005; pp. 1102-1106; IEEE.
Meijer, Peter B. L.; "Fast and Smooth Highly Nonlinear Multidimensional Table Models for Device Modeling"; IEEE Transactions on Circuits and Systems; Mar. 1990; vol. 37, No. 3; pp. 335-346 IEEE.
Lu, Ning et al.; "Accurate and Efficient Table-Lookup Approach in ASX"; IBM Microelectronics; First Quarter 1999; pp. 20-30; IBM.
U.S. Appl. No. 13/214827, filed Aug. 22, 2011.
Herlihy et al.; "Hopscotch Hashing"; 16 Pgs; www.cs.tau.ac.il/~liortzaf/papers/disc2008_submission_98.pdf.

(Continued)

*Primary Examiner* — Thai Phan (57) ABSTRACT

A mechanism for improving speed of table model-based simulation of complex circuits that include transistors and other devices that share similar properties is provided. Circuit simulation speed is improved by efficiently identifying transistors and other devices having substantially the same properties that share a same state at the time of interest in the simulation. Transistors and other devices are collected into groups having the same characteristics and topologies prior to simulation. Then during simulation, a determination is made as to whether a previously-evaluated transistor or device in the same group as a presently-being evaluated transistor or device has terminal input values that are the same, or nearly the same. If so, a cache lookup is performed to determine table model solution values for the previously-evaluated transistor or device, and those values are used to determine exact output values per the table model of the presently being evaluated transistor or device.

20 Claims, 7 Drawing Sheets

(56) References Cited

OTHER PUBLICATIONS

Alvarez et al.; "Fuzzy Memoization for Floating-Point Multimedia Applications"; IEEE Transactions on Computers; Jul. 2005; pp. 922-927; vol. 54, No. 7; IEEE.

Cheng et al.; "A Fast Method for MOS Model Evaluation in VLSI Simulation with Controllable Error"; China 1991 International Conference on Circuits and Systems; Jun. 1991; pp. 200-203; IEEE.

* cited by examiner

TABLE MODEL CIRCUIT SIMULATION ACCELERATION USING MODEL CACHING

BACKGROUND

1. Field

This disclosure relates generally to acceleration of resource intensive numerical calculations, and more specifically, to accelerating simulation of a device within a large circuit by utilizing previously computed values corresponding to another device within the circuit when it is determined that both devices share the same state.

2. Related Art

Electronic circuit simulation uses mathematical models to replicate the behavior of an actual electronic device or circuit. Simulating circuit behavior before actually building the circuit can improve design efficiency by making faulty designs known and providing insight into the behavior of the circuit. Typical circuit simulators can include both analog and event-driven digital simulation capabilities. An entire mixed signal analysis can be driven from one integrated schematic.

Circuit simulation of complex circuit systems (e.g., systems on a chip) can involve thousands of transistors and other devices. A significant portion of the cost of circuit simulation is that of computing the characteristics of the transistors as coded in transistor models. For example, in simulation of phase locked loops (PLL), analog-digital converters (ADC), digital-analog converters (DAC), and DC-DC converters, computing transistor characteristics can consume 60% to 90% of the cost of simulating a complex circuit. Simulation of analog/mixed-signal full-chip systems at a transistor level can take weeks and require very high accuracy.

It is therefore desirable to speed up transistor level simulation of integrated circuit systems without suffering a loss in accuracy. Further, it is desirable to achieve such acceleration in simulation without consuming a significant amount of additional system memory in the simulator.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. Figures are not necessarily drawn to scale.

DETAILED DESCRIPTION

A mechanism is provided for improving speed of table model-based simulation of complex circuits that include transistors and other devices that share similar properties. Circuit simulation speed is improved by efficiently identifying transistors and other devices having substantially the same properties that share a same state at the time of interest in the simulation. Transistors and other devices are collected into groups having the same characteristics and topologies prior to simulation. Then during simulation, a determination is made as to whether a previously-evaluated transistor or device in the same group as a presently-being evaluated transistor or device has terminal input values (e.g., voltages) that are the same, or nearly the same. If so, a cache lookup is performed to determine table model solution values for the previously-evaluated transistor or device, and those values are used to determine exact output values per the table model of the presently being evaluated transistor or device. If not, then a full table lookup is performed, and information regarding this lookup is stored in the table model cache.

Determining whether a presently-being evaluated transistor or device is in substantially the same state as a previously-evaluated transistor or device is performed by evaluating whether the terminal input values are in the same cell of an n-dimensional grid associated with the model table as the previously-evaluated transistor or device. Then the output values calculated for the previously-evaluated transistor are used to extrapolate solution values for the present transistor, using known behavior of the solution within the table cell (e.g., slope of a piecewise linear solution or using polynomial coefficients calculated for the solution within the table cell for a non-piecewise linear solution). Grid vertex values approximating inputs for the presently-being evaluated transistor are used as inputs to a hashing algorithm that allows for quick evaluation of whether the state of the present transistor matches that of a previously-evaluated transistor having similar properties. If so, then the previously cached values are used in conjunction with a known slope for the previously calculated table cell, to determine accurate output values for the present transistor. When a piecewise linear table model is used, for example, extrapolated results are identical to table interpolation since the input bias is in the same interpolation cell, as will be discussed more fully below.

In order for overall simulation speeds to improve, embodiments of the present invention not only use an efficient method for populating the solution table, but also an efficient mechanism for storing and retrieving information regarding previously-evaluated transistors is used. As indicated above, input values needed for transistor simulation are approximated to grid vertex values used as inputs to a hash function. A model cache having the hash values as an index (e.g., a hash table) is used to evaluate whether an entry corresponding to the hash value and storing the approximate input values is present. If so, that entry of the model cache is referenced to access calculated table model values for the previously-evaluated transistor. The model cache can be filled in a way that keeps similar hash index values close to one another for efficient lookup. Further efficiencies are arrived at by adding no additional entries to the model cache once 80% of table space has been consumed. Finally, in order to conserve resources of the system running the simulation, embodiments of the present invention can store the model cache in memory space already allocated for the simulation.

Circuit Simulation

Figure 1:
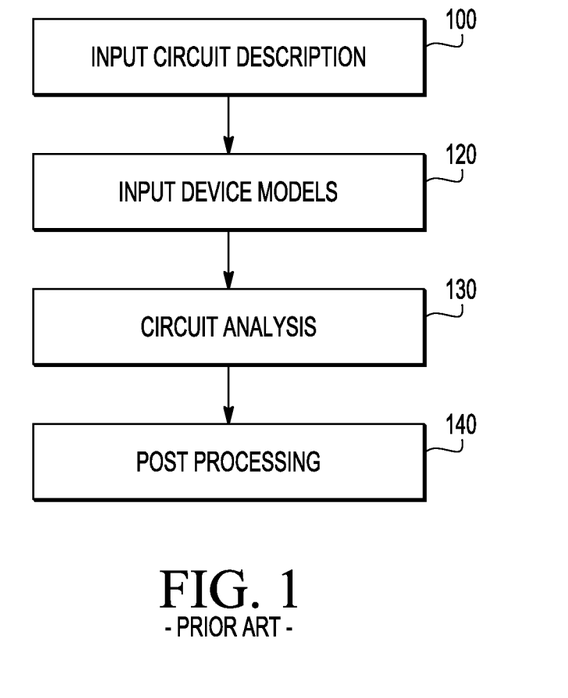
FIG. 1 is a simplified block diagram illustrating basic steps performed by a typical circuit simulator.

FIG. 1 is a simplified block diagram illustrating basic steps performed by a typical circuit simulator. Embodiments of the present invention improve performance of one or more of these basic steps.

Typically, a first step in circuit simulation involves providing a description of the circuit to be simulated (110). One mechanism for providing the circuit description is use of a netlist. A netlist can contain or refer to descriptions of the parts or devices used in the circuit. The netlist can contain definitions of parts used in the circuit and list connections that can be made to that type of device and basic properties of the device. Device instances can encompass a wide variety of parts including, for example, MOSFET transistors, bipolar transistors, resistors, capacitors, integrated circuits, and the like. The circuit description can also include how the various parts of the circuit to be simulated are connected to one another.

In addition to providing a description of the circuit and the various parts of that circuit, a typical step in simulation is provision of models for devices used in the circuit (120). Certain devices found in a circuit can have complicated behavior that is a function not only of inputs to the device, but also a function of how the device was assembled, operating conditions of the device (e.g., temperature), and the like. In order to ensure reliable simulation of devices exhibiting complicated behavior (e.g., transistors), scientific modeling of physical phenomena observed in their operation is performed. Typical models are based upon device physics (physical models) and curve fitting (empirical models) and provide mathematical descriptions of the nonlinear behavior of devices, such as transistors. In addition, different device models can be used for the varieties of types of transistors (e.g., bipolar junction transistors, JFETs, MOSFETs, and MESFETs).

Once a description of the circuit is provided and models for devices used in the circuit are provided, analysis of the behavior of the circuit can be performed (130). Such analysis can involve provision of initial conditions (e.g., initial input values and operating conditions) of the circuit at a particular time along with information related to how input values change over time, if any. Analysis can further involve translating the listing of the devices in the circuit, their connections, and the models for the devices into equations to be solved. Typically, the general equations produced are nonlinear differential-algebraic equations solved using, for example, implicit integration methods, Newton's method, and sparse matrix techniques.

Thus, circuit simulation often involves solving nonlinear differential-algebraic equations, which requires evaluating mathematical descriptions of the nonlinear models, a process called device evaluation. This stage of circuit simulation is typically the most costly in terms of time and resources. Device evaluation (e.g., solving for various values of current, charge, and derivatives of those values at the various terminals of devices in the circuit) can contribute to between 20-90% of total cost of simulation. Embodiments of the present invention reduce the time spent during the device evaluation over traditional methods, especially in very large circuits.

Schemes for reducing time spent during device evaluation include, for example, parallel model evaluation and table models. Parallel model evaluation involves simultaneously utilizing a number of processors or processor cores to evaluate different devices in a circuit. While there can be some speed up in real time realized by utilizing multiple processors, the benefits of the parallel model have less of an impact when a number of devices to be evaluated within a circuit greatly exceed the number of processors available to perform the calculations.

Traditional table models use lookup tables containing a large number of dimensions (e.g., voltages), each associated with a terminal of the device. At each node of the table model, common device parameters such as drain current and charge (or channel charge for MOSFETs) are stored. These values are indexed in reference to their corresponding terminal voltage (or bias voltage) combinations. Model accuracy is typically increased by inclusion of additional data points within the table. While the use of tables can decrease simulation time, typical tables consume a considerable amount of storage memory and can have decreased accuracy when determining solutions for data points not stored in the table. Thus, typical table models trade accuracy for speed and storage memory. Further, as table sizes increase, the time to search the tables also increases, thereby reducing the speed benefits of table models. Also, as a number of table dimensions increase, typical table models suffer costs associated with geometrically increasing storage and table population. Embodiments of the present invention seek to maintain solution accuracy while also benefiting from improved simulation speed utilizing table models, while also avoiding the costs associated with increasing storage and table population.

Subsequent to performing circuit analysis, the circuit simulator of FIG. 1 performs a variety of post-processing tasks (140). Post processing tasks can include signal processing of circuit outputs, filtering, waveform analysis, displaying results, and the like. Such tasks are determined by the nature of the application.

Figure 2:
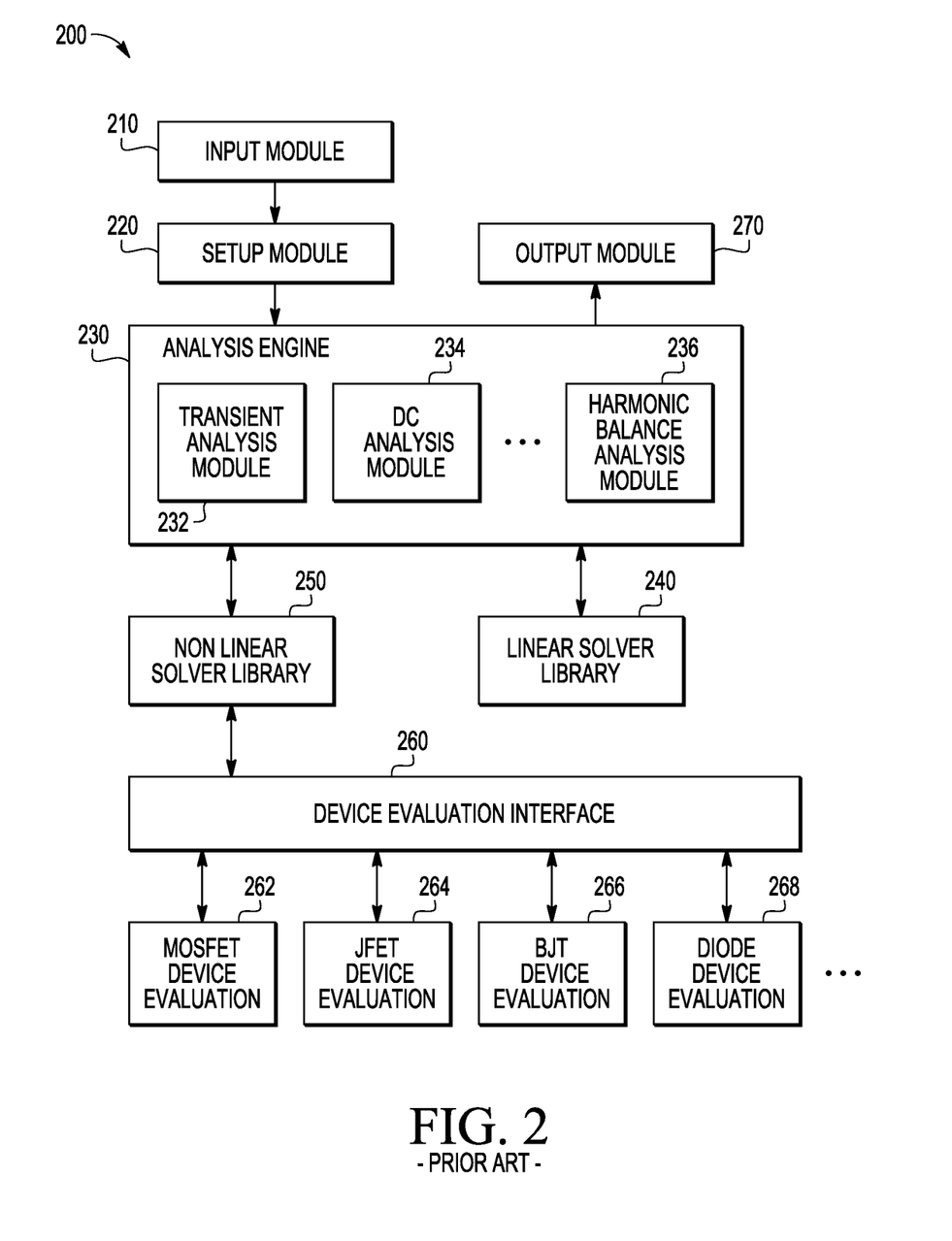
FIG. 2 is a simplified block diagram illustrating elements of a typical circuit simulator system, usable by embodiments of the present invention.

FIG. 2 is a simplified block diagram illustrating a typical circuit simulation system, usable by embodiments of the present invention. Circuit simulation system 200 includes an input module 210. As discussed above with respect to FIG. 1, an initial step in simulation of a circuit is provision of a description of the circuit to be simulated. Input module 210 reads the information provided regarding the devices in the circuit and identification of models used to represent those devices. In addition, input module 210 can also provide a mechanism for inputting any requests for types of analysis (e.g., DC or transient) and other types of analysis parameters (e.g., stop time, relative tolerance, absolute tolerance, and the like). Input module 210 can also provide a mechanism for a user to specify output requests. Input module 210 can also provide different types of interfaces for receiving the inputs, such as a schematic editor and the like.

Input module 210 passes the inputs received to a setup module 220. The setup module performs a variety of tasks prior to the circuit simulator engaging in analysis. For example, setup module 220 can determine the kind of analysis desired, set up arrays to store various values for calculation, process user-specified models, and generate code related to the equations to be solved.

Analysis of the behavior of the circuit is performed by analysis engine 230. Analysis engine 230 can include a variety of analysis modules corresponding to the type of analysis requested by the user or required for the application. Examples of analysis modules provided in FIG. 2 include a transient analysis module 232, DC analysis module 234, and harmonic balance analysis module 236. As discussed above, circuit simulation can involve solving both linear equations and non-linear equations. Analysis engine 230 accesses libraries that provide functions for solving both the linear equations (240) and the non-linear equations (250).

Circuit simulation system 200 provides a set of device evaluation routines accessible to nonlinear solver library 250 through a device evaluation interface 260. As types of devices in a circuit that correspond to the available device evaluation routines are analyzed, device evaluation interface 260 invokes the appropriate device evaluation routine. Typical device evaluation routines correspond to commonly encountered devices that have associated models (e.g., table models). As the example in FIG. 2 shows, some device evaluation routines accessible to a circuit simulation system are routines for MOSFET device evaluation 262, JFET device evaluation, bipolar junction transistor device evaluation 266, diode device evaluation 268, and the like.

As the circuit analysis is performed, analysis engine 230 can provide output values to output module 270. Output module 270 can provide post processing tasks, such as curve plotting of outputs, interpolation, and providing results to a display device.

Duplicate Circuit Elements

One method by which embodiments of the present invention seek to improve circuit simulation speed is by avoiding duplication of certain calculations. As discussed above, a typical simulated circuit can include many thousands of transistors. Of those transistors, a significant portion of them can be of the same configuration and be at the same state (i.e., having the same, or nearly the same, terminal values). By recognizing those transistors that are the same as having been previously been analyzed, the previous results can be used to determine appropriate solution values for the matching transistors. This avoids expensive table lookups that may span a large space in memory and incur cache misses.

In order for transistors to match one another they should be physically the same. That is, the transistors should be of the same type (e.g., bipolar junction transistors, JFETs, MOSFETs, MESFETs, and the like). Further, the transistors should be in the same topology. That is, connections between terminal nodes of a transistor, if any, should be the same. Embodiments of the present invention provide for grouping transistors by type and topology. During initial processing of devices, transistors are grouped by type and topology and associated with a group identifier.

Additionally, in order for a presently evaluated transistor to be "the same" as a previously evaluated transistor, the state of the transistors should be substantially the same. That is, the terminal input values for the simulation model should be the same, or nearly the same, as that of the previously-evaluated transistor. Since the number of transistors having identical terminal input values will likely be very small, embodiments of the present invention take advantage of being able to calculate accurate output values for a transistor using table model values calculated for a previously-calculated transistor that has input values that are within the same table model grid cell as those of a previously-evaluated transistor. A transistor whose state appears in the same grid cell as another transistor can be evaluated via extrapolation with zero error compared to a full table lookup. A transistor "being in the same state" means having input values that are in the same table model grid cell. Since this is more likely than two states being very close to identical, as required for previous fully analytical model caching methods, model caching becomes more practically useful in the context of table models, either piecewise linear tables or polynomial tables.

Figure 3:
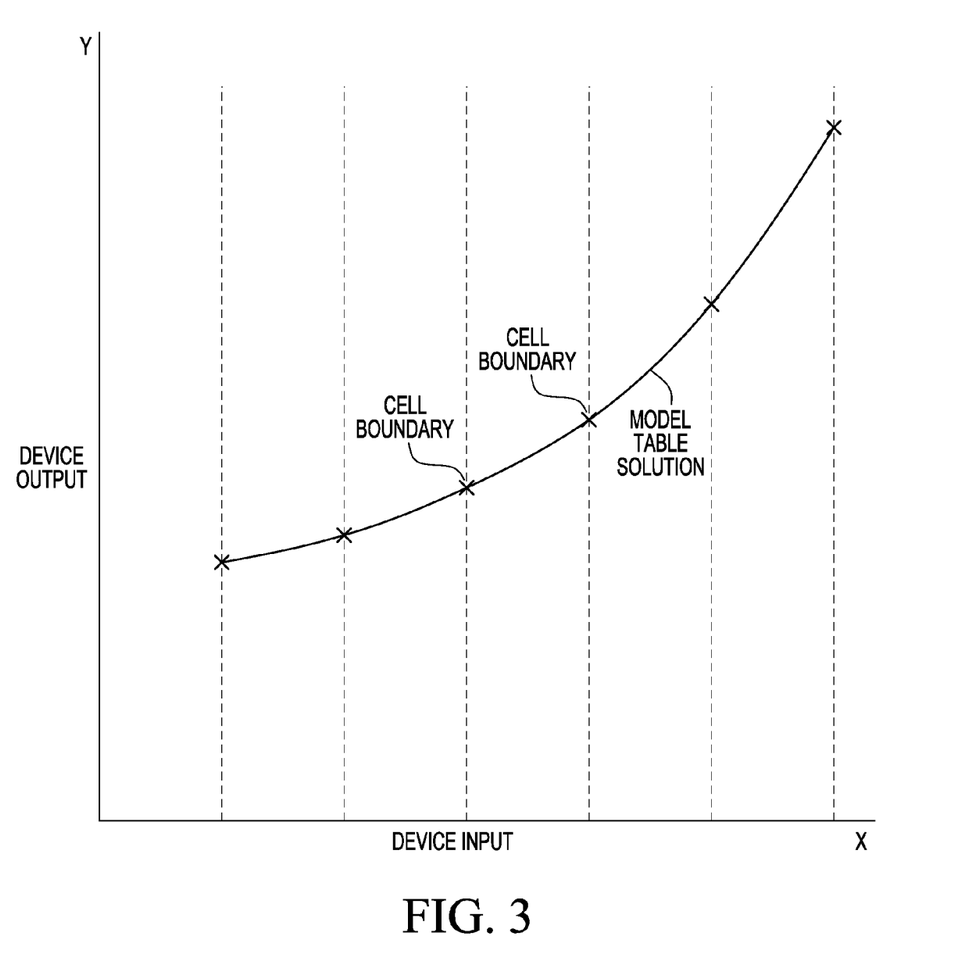
FIG. 3 is a simplified chart illustrating a use of approximate input values in deriving accurate output values using a model table, according to an embodiment of the present invention.

FIG. 3 is a simplified chart illustrating a use of approximate input values in deriving accurate output values using a model table, according to an embodiment of the present invention. FIG. 3 is a two-dimensional graph of illustrating a solution curve for an input A on the X-axis and an output B on the Y-axis. The solution curve (OUT) for a device is illustrated on the graph. A set of solution cells that contain the solution curve are bolded on the chart. Vertex values associated with each of the solution cells are indicated with an "X"

As discussed above, characteristics of transistors and other semiconductor devices are typically reflected by complicated nonlinear mathematical expressions. In one embodiment, in order to simplify calculation of these mathematical expressions, the table model values can be calculated in a piecewise linear fashion. For example, within each cell of a two-dimensional grid that includes the solution curve, the solution is described as a line between two points (e.g., where the solution curve intersects the boundary of the cell). For higher dimensionalities, the solution is described by features of higher dimensional spaces (e.g., planes for cubes and hyperplanes for hypercubes). Calculating an output value for an input value within a cell can thus be performed by, for example, (a) a calculation of the output value using a formula describing the solution within a determined cell (e.g., using the vertex values at the edges of the cell [or an n-dimensional hypercube for n-dimensions] to get the transistor values at the desired inputs), or (b) using the slope within the cell along with a known previously-calculated value along the line within the cell. Since the table model solution is constructed using simplicial interpolation, there is zero error for a subsequent output value that is calculated using a previous lookup (i.e., example (b)) as compared with a full table lookup. That is, the new output, $F(V_{new})$, is derivable from the previously calculated output $F(V_{old})$, using an equation of the form: $F(V_{new})=F(V_{old})+F'(V_{old})*(V_{new}-V_{old})$. The value of $F'(V_{old})$, the slope of the function at $V_{old}$, is in agreement with the table model lookup since the table model itself is piecewise linear.

Embodiments of the present invention are not limited to piecewise linear table models. Benefits can extend to non-piecewise linear tables. For example, with a polynomial table model, polynomial coefficients can be stored in association with a cell identifier. Those polynomial coefficients can be used to extrapolate the solution within the cell—again giving zero error as compared with a full table lookup.

Conducting a direct table lookup for each transistor can be resource intensive, as discussed above, in part because it can span a large space in memory and incur multiple cache misses, proportional to the number of table dimensions. But if another transistor has been looked up in the table previously, and the results of that calculation cached, output values associated with a subsequent transistor falling within the same cell can be more efficiently calculated using the previously cached values. This is because a table lookup is no longer required, but instead a linear extrapolation can be performed from the previous values.

Advantages of this method apply not only to other transistors having substantially similar values, but also to transistors that are latent (e.g., the input voltages do not change substantially over time steps). Latent transistors can thus use cached output values for that transistor calculated at a previous time step as at least a reference point for calculation of values at a current time step. Again, in this manner, resource intensive table lookups can be avoided by performing a cache search instead of searching within the full table.

Model Cache and Hashing

A typical circuit simulator stores output solution values for each device simulated in a circuit during the circuit analysis process. As discussed above, these output values can include current, charge and derivatives of those values at each node of devices in the circuit (e.g., transistor gate, drain, source, body/ bulk, and the like). These output values are stored in a memory location and associated with the device for which the values are a solution.

In order to use previously evaluated solution values to calculate solution values for a current device, an efficient method for storing input and output values, matching input values with previously calculated input values (e.g., grid vertices), and deriving output values is utilized by embodiments of the present invention. As discussed above, matching a currently evaluated device with a previously evaluated device can be performed by looking up devices having the same physical and topological characteristics with approximately the same input values. One mechanism employed by embodiments of the present invention for performing such matching is to use table model caches having a hash of the cell vertex values as an index. In one embodiment of the present invention, separate table model caches are employed for each different group of devices (e.g., devices having the same physical and topological characteristics).

Embodiments of the present invention are not limited by the specific hash value algorithm used. In one embodiment, however, the hashlittle function is used because this function is relatively fast for variable byte strings (e.g., http://burtle-burtle.net/bob/c/lookup3.c).

Hashing typically results in different sets of vertex values having a same hash value. In a case where multiple sets of inputs result in a same hash value, a determination should be made to determine which entry corresponding to the hash value in a table model cache corresponds to the inputs presently being applied to the device. One manner for doing this is to check each entry associated with a hash index value to determine whether the vertex values in the entry correspond to the vertex values, corresponding to the current input values, and used to generate the current hash value.

Such checking of entries having a same hash value can be performed more efficiently if those entries are kept close in the model cache. One mechanism for associating entries with a same hash value is to store each such matching entry as a link from a single entry in the table model cache (e.g., a chained hashing scheme). As additional entries are generated having a same hash value, those entries are links to the indexed entry in the model cache causing an expanding entry. There can be a significant memory cost to such linking of entries, as well as a cost in looking up entries down the link chain. To avoid this cost, one embodiment of the present invention provides for entries in the table model cache held to a fixed size. When new instances of devices are generated having a same hash value as a previous device, they are added to the table model cache as new entries rather than as links to an entry. In order to store these additional entries in a manner that allows for efficient lookup (e.g., keeping the entries together), the hash indexed table model cache can be maintained using, for example, a hopscotch hashing scheme.

In a hopscotch hashing scheme, an item associated with an indexed entry of the table model cache will always be found either in the indexed entry, or in a neighborhood of that entry. The neighborhood of an entry can be defined as one of the next H−1 entries, where H is a constant (e.g., in one embodiment, H equals 32 which is a standard machine word size). Using such a scheme, a "virtual" bucket having a fixed size is created which overlaps with the next H−1 buckets. Each entry of the model cache can include a hop-information word, which is an H-bit bitmap that indicates which of the next H−1 entries contain items that hashed to the current entry's virtual bucket. In this way, entries corresponding to a hash value can be found quickly by examining the hop information word in an entry corresponding to a hash value to determine those entries belonging to the bucket, and then scanning through those entries for matching input values.

A hopscotch hashing scheme ensures storage of new entries having a hash value in the neighborhood of other entries having the same hash value by moving empty spaces within the table model cache toward the desired bucket, instead of leaving a new entry in the first found empty space. Storage of a new entry in a table model cache using a hopscotch scheme is performed in the following manner (for an item x where hash(x)=i):

If the entry at i is empty, store x in i, else
Starting at i, use linear probing to find an empty entry at index j;
If the empty index j is within H−1 of i, store x in j; else
If j is too far from i, find an item y whose hash value is between i and j, but within H−1 of j, and whose entry lies below j (i.e., toward i). Displacing y to j creates a new empty slot closer to i. Repeat until an empty entry is created within H−1 of i or an empty entry is created at i.
Store x in the entry within the neighborhood of i.

As stated above, storing entries having the same hash values in this manner allows for efficient lookup of entries to determine whether inputs match for entries having the same hash value. Each entry of the table model cache can include not only the hash value index but also the approximate input values used to generate the hash value, as well as an identifier of the memory location in which the solution for the associated device is stored. As can be seen, the hopscotch hash scheme can consume some overhead in moving empty entries to a neighborhood of a calculated hash index. In order to maintain an acceptable overall efficiency of storage and lookup of entries, one embodiment of the present invention maintains the model cache at a level of no more than 80% of a predetermined capacity. This avoids excessive overhead incurred by moving empty spaces.

Figure 4:
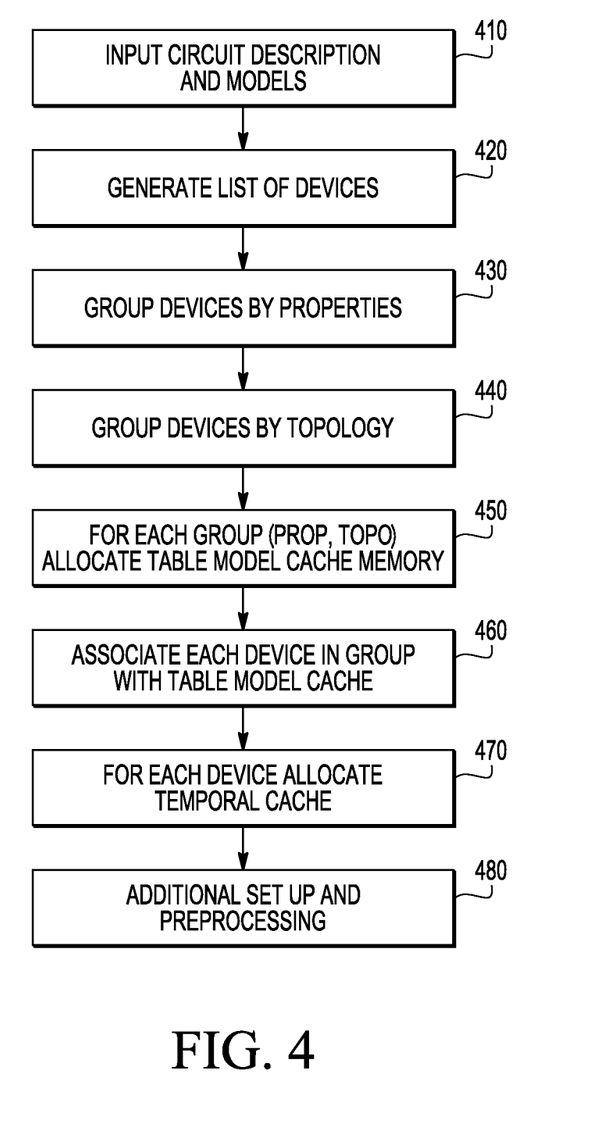
FIG. 4 is a simplified flow diagram illustrating steps performed prior to circuit simulation by one embodiment of the present invention.

FIG. 4 is a simplified flow diagram illustrating steps performed prior to circuit simulation by one embodiment of the present invention. As discussed above, an initial step in typical circuit simulation is an input of the circuit description and device models (410). Once the description has been provided, a list of devices found in the circuit description can be generated (420). The devices can then be grouped by physical properties of those devices (430). For example, in the case of transistors, property groupings can be by the various types of transistors (e.g., bipolar junction transistors, MOSFETs, and the like) as well as doping types, size, and the like (e.g., physical properties). Such property groupings can be performed by an analysis of the description of each device in the netlist, or an identification of a grouping can be provided as part of the device entry in the netlist. To provide additional efficiency in lookup of similar devices, devices can also be grouped by topology (440). As discussed above, topological grouping can be performed according to which terminals of a device are coupled together, if any, for example. Such topological grouping can improve simulation efficiency by reducing the number of terminal inputs needed for certain devices.

Once the devices have been grouped by properties and, optionally, by topology, a table model cache can be allocated in memory for each grouping (450). Each device in the circuit description can then be associated with a table model cache correlated to the device's group (460).

In addition, for a simulation involving transient analysis, each device can have a temporal cache memory allocated (470). The temporal cache memory can be used to store solution values for the device at a preceding time in the simulation, as will be discussed more fully below. Additional setup and preprocessing can be performed prior to circuit analysis (480). In one embodiment of the present invention, the table model caches and temporal cache are stored in memory allocated for circuit simulation, thereby conserving system resources.

Figure 5:
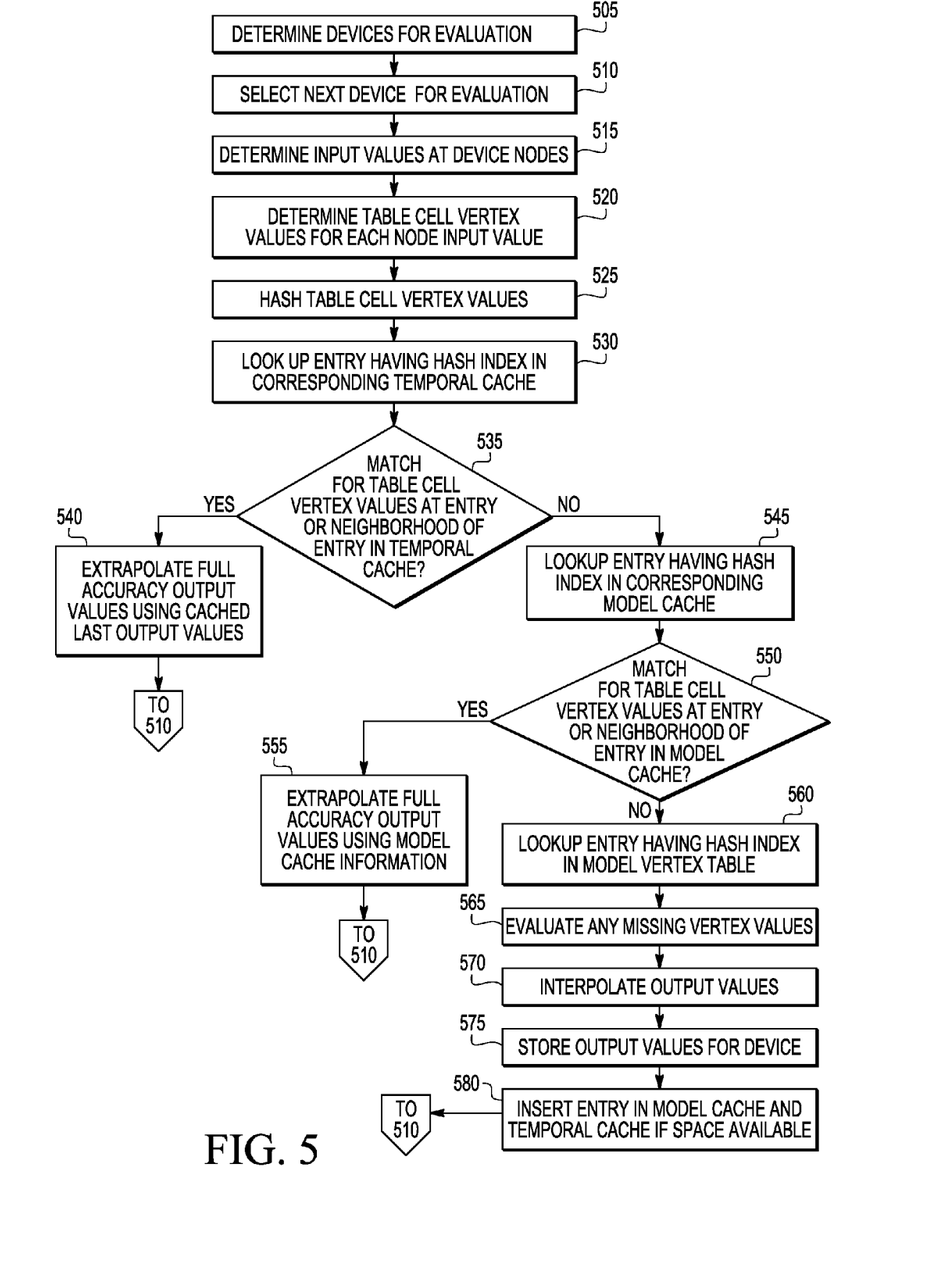
FIG. 5 is a simplified flow diagram illustrating steps performed in determining whether a previously evaluated device corresponds to a currently being evaluated device, in accord with one embodiment of the present invention.

FIG. 5 is a simplified flow diagram illustrating steps performed in determining whether a previously-evaluated device corresponds to a presently-being evaluated device, in accord with one embodiment of the present invention. A set of devices is determined for evaluation (505). This set of devices can be chosen, for example, by type (e.g., transistor) or can be selected for a particular processor to perform simulation (e.g., in a multi-processor simulator). Once the set of devices has been determined, a device is selected for evaluation (510).

A set of actual input values can then be determined for the various nodes of the selected device (e.g., gate, drain, and source) (515). These input values can be provided, for example, as part of the initial conditions of the circuit being simulated, or can be received from solutions of a previously evaluated device. For the set of actual input values, a set of table cell vertex values can be determined (520). As discussed above with regard to FIG. 3, the table cell vertex values are associated with a regular grid of the n-dimensional table model for the selected device. These table cell vertex values will correspond with a "root" or "lower" vertex in the grid. A hash value is then generated using the table cell vertex values (525). Any hashing calculation can be used to generate the hash value. As discussed above, in one embodiment of the present invention, the hashlittle function by Bob Jenkins is used to generate the hash value.

Once a hash value has been generated from the table cell vertex values, a lookup is performed on the temporal cache corresponding to the device (530). The calculated hash value is compared to the index values of the corresponding temporal cache. The temporal cache stores table model vertex entries for the device calculated at a previous instant in time (e.g., the immediately previous time step at which the circuit was evaluated). A determination is made as to whether a match for the table cell vertex values of the current device is stored at the indexed entry of the temporal cache or within the neighborhood of the entry (535).

The temporal cache can store entries that include the table cell vertex values of the associated device as well as an identifier of the memory space of data associated with the referenced cell for that device. If there is a match, then a set of output values at the present time for the device can be calculated using the cached table model values for the previous instant in time (540). The stored output values can be used to extrapolate in view of the difference between the input values for the device evaluated at the previous instant in time and the device at the current time, using a derivative of the solution at the vertex. Once the output values for the present device are calculated, at the current time, the process can proceed with selection of the next device for evaluation (510). The output values obtained this way are identical to those that would be obtained from a full table lookup.

If there is no match for the table cell vertex values in the model temporal cache (535), then a lookup is performed on the model cache corresponding to the table model for the group of the device (545). The calculated hash value is compared to the index values of the corresponding model cache. In addition to the table cell vertex values of the associated device type and an identifier of the memory space of data associated with the referenced cell for the device type, the entry can be associated with a hop-information word that identifies additional entries in the model cache that are associated with the hash index. The neighborhood entry lookup can be accelerated by using the hop-information word to identify those entries in the model cache that are associated with the hash index value, and then searching those entries for matching stored input values. A determination is made as to whether a match for the table cell vertex values of the current device is stored at the indexed entry of the model cache or within the neighborhood of the entry (550).

If there is a match for the table cell vertex values, then a set of output values can be calculated using stored table model information for the previously-evaluated device (555). As discussed above, the stored table model information is used in extrapolating in view of the difference between the input values for the previously-evaluated device and those of the present device, using a derivative of the solution at the vertex. Once output values for the present device are calculated, the process can proceed with selection of the next device for evaluation (510). Again, the output values obtained this way are identical to those that would be obtained from a full table lookup.

If the table cell vertex values are not found in either the temporal cache or the model cache, then a full table model evaluation is performed on the present device. A lookup is performed on a model vertex table for an entry corresponding to the hash index (560). The vertex table holds results of evaluations of the model at various vertices and links to the near neighbors in the table hypercubes. If any needed vertices are not found during the lookup, those vertices are evaluated and stored in the vertex table (565). Once all needed vertices for the table cell exist, the output values are calculated using a simplicial interpolation (570). Those output values are stored for the device (575).

An entry can then be inserted into the model cache at the index value, or the neighborhood thereof, if space in the model cache is available, and similarly in the temporal cache for the device (580). Entry insertion into the model cache can follow the hopscotch scheme discussed above, but is not limited thereto. Any scheme for entry insertion can be used, if it leads to an efficient mechanism for entry lookup. Further, as noted above, one embodiment of the present invention provides that if the allocated memory for the model cache is greater than 80% full, then the entry cannot be added to the table. In such cases, no matches for subsequent devices having the same characteristics and input values as the present device will be found and a full simulation of those devices will be performed. Once the entry is stored, or a determination that no space is available, the process can proceed with selection of the next device for evaluation (510).

Embodiments of the present invention can utilize the above methodology to improve speed of circuit simulation when there is significant repetition of devices within the circuit being evaluated. Typically, the device type that has the most repetition in a circuit is transistors. Thus, the above discussion may use transistors as a device type in many examples. It should be realized that embodiments of the present invention do not require that a device being examined for repetition be a transistor, and that embodiments of the present invention can be used for other repeated devices in a circuit as long as the relationship between inputs and outputs are well-behaved, as modeled by a piecewise linear table.

Now it should be appreciated that, in one embodiment of the present invention, there has been provided a method for simulating a circuit that includes: determining a table model cell corresponding to a set of input values of the device in the circuit; determining a hash value for a set of vertex values associated with the table model cell; and, if a model cache entry associated with the hash value includes values matching the table model vertex values, then retrieving previously calculated output values corresponding to the model cache entry and calculating output values for the device using the previously calculated output values corresponding to the model cache entry and information associated with a table model cell. In one aspect of this embodiment, determining the table model cell includes calculating a nearest vertex value for a dimension of an n-dimensional hypercube associated with the table model, where a dimension corresponds to an input value of a set of input values of the device (e.g., node voltages).

Another aspect of the above embodiment includes determining whether the model cache entry associated with the hash value includes values matching the table model vertex values. This determining further includes: looking up a first entry in the model cache having an index that equals the hash value; determining if the first entry includes values matching the table model vertex values; if the first entry includes values matching the table model vertex values then selecting the first entry; and, if the first entry does not include values matching the table model vertex values then looking up one or more entries in a neighborhood of the first entry, determining if one of the one or more entries in the neighborhood of the first entry includes values matching the table model vertex values, and if one of the one or more entries in the neighborhood of the first entry includes values matching the table model vertex values selecting the entry including the matching values. In a further aspect, the neighborhood of the first entry includes a predetermined number of entries following the first entry in the model cache. In another further aspect, looking up the one or more entries in a neighborhood of the first entry further includes reading a hop-information word stored in association with the first entry where the hop-information word includes indicia of entries in the neighborhood that are associated with the index of the first entry, and looking up entries in the model cache that correspond to the indicia provided in the hop-information word.

In another aspect of the above embodiment an entry of the model cache includes table model vertex values for a device associated with the entry and an identifier of a memory location storing the previously calculated output values for the device associated with the entry.

Another aspect of the above embodiment further includes, if no model cache entry associated with the hash value has values matching the table model vertex values, then calculating output values for the device using the set of input values, storing the calculated output values in Association with a device identifier, and storing a new entry in the model cache. The new entry includes the table model vertex values and an identifier of the storage location of the output values and the new entry is associated with the hash value. In a further aspect, the storing of the new entry in the table model cache further includes determining if a storage entry in the model cache having an index value corresponding to the hash value for the set of table model vertex values is empty; if the storage entry is empty, then storing the new entry at the storage entry; and if the storage entry is not empty then finding a closest empty entry to the entry in the model cache having the index value corresponding to the hash value, if the closest empty entry is in a neighborhood of the entry in the model cache having the index value corresponding to the hash value and storing the new entry at the closest empty entry, and if the closest empty entry is not in the neighborhood of the entry in the model cache having the index value corresponding to the hash value using hopscotch hashing table management to move an empty entry to the neighborhood of the entry in the table model cache having the index value corresponding to the hash value.

In another aspect of the above embodiment, said calculating the output values for the device using the previously calculated output values corresponding to the model cache entry and information associated with table model cell includes extrapolating the output values for the device from the previously calculated output values corresponding to the table model cache entry. In a further aspect, extrapolating includes: calculating a difference between an input value of the device from the set of input values and a corresponding input value from a previously-evaluated device corresponding to the previously-calculated output values; and multiplying the difference by a slope of the solution for the output value in the table model cell and adding the result to the previously calculated output value. The information associated with the table model cell includes the slope of the solution for the output value in the table model cell.

Another embodiment of the present invention provides a circuit simulation system that includes: an input module configured to receive a description of a circuit for simulation; a first memory storing a model cache comprising one or more entries; a second memory storing output values corresponding to the one or more entries; and, an analysis engine. The analysis engine is configured to determine a table model cell corresponding to a set of input values of a device wherein the input module provides information regarding the device from the description of the circuit, determine a hash value for a set of table model vertex values associated with the table model cell, and if a model cache entry associated with the hash value stored in the table model cache comprises values matching the table model vertex values then the analysis engine is further configured to read previously calculated output values corresponding to the model cache entry from the second memory, and calculate output values for the device using the previously calculated output values corresponding to the model cache entry and information associated with the table model cell.

In one aspect of the above embodiment the analysis engine is further configured to determine the table model cell for a set of input values of a device by being further configured to calculate a nearest vertex value for a dimension of an n-dimensional array associated with the table model, where the dimension corresponds to an input value of the set of input values of the device.

In another aspect of the above embodiment the analysis engine is further configured to determine whether a model cache entry associated with the hash value includes values matching the table model vertex values. This determining is performed by virtue of the analysis engine being further configured to: lookup a first entry in the model cache having an index that equals the hash value; determine if the first entry comprises values matching the table model vertex values; if the first entry includes values matching the table model vertex values, then select the first entry; and, if the first entry does not include values matching the table model vertex values then the analysis engine is configured to look up one or more entries in a neighborhood of the first entry, determine if one of the one or more entries in the neighborhood of the first entry comprises values matching the table model vertex values, and if one of the one or more entries in the neighborhood of the first entry comprises values matching the table model vertex values, select the entry comprising the matching values.

In still another aspect of the above embodiment, if no entry stored in the model cache associated with the hash value includes values matching the table model vertex values, the analysis engine is further configured to: calculate output values for the device using the set of input values; store the calculated output values in association with a device identifier in the second memory; and, store a new entry in the model caching in the first memory. The new entry includes the table model vertex values and an identifier of the storage location of the output values, and the new entry is associated with the hash value. In a further aspect, the analysis engine calculates the output values for the device using the set of input values by being further configured to: determine if each table model vertex value and the nearest neighbor vertex values exist in a vertex table; calculate any missing table model vertex values and missing nearest neighbor vertex values using the table model; store the calculated table model vertex values and nearest neighbor vertex values in the vertex table; and, calculate the output values using a simpler shuttle interpolation on the table model vertex values. In still a further aspect, the analysis engine is further configured to store the calculated output values and the second memory, and store a corresponding model cache entry in the first memory. In still a further aspect, the circuit simulation system further includes a third memory storing a temporal cache corresponding to the device that comprises one or more entries. In this aspect, the analysis engine is further configured to: store the calculated output values in an entry of the third memory associated with the hash value; for a subsequent set of input values of the device the analysis engine will determine a second hash value for a second set of table model vertex values for a second table model cell corresponding to the subsequent set of input values for the device and if the second hash value matches the hash value, read the calculated output value stored in the entry of the third memory and calculates subsequent output values using the calculated output values.

In another aspect, the analysis engine stores the new entry in the model cache by being further configured to: determine if a storage entry in the table model cache having an index value corresponding to the hash value for the set of table model vertex values is empty; if the storage entry is empty then store the new entry at the storage entry; and, if the storage entry is not empty then find a closest empty entry to the entry in the table model cache having the index value corresponding to the hash value, if the closest empty entry is in a neighborhood of the entry in the table model cache having the index value corresponding to the hash value store the new entry at the closest empty entry, and if the closest empty entry is not in the neighborhood of the entry in the table model cache having the index value corresponding to the hash value use hopscotch hashing table management to move an empty entry to the neighborhood of the entry in the table model cache having the index value corresponding to the hash value.

In another aspect of the above embodiment, the analysis engine calculates the output values for the device using the previously calculated output values corresponding to the entry by virtue of being configured to extrapolate the output values for the device from the previously calculated output values corresponding to the table model cache entry. The extrapolating includes calculating a difference between an input value of the device from the set of input values and a corresponding input value from a previously-evaluated device corresponding to the previously-calculated output values, and multiplying the difference by a slope of the solution for the output value in the table model cell and adding the result to the previously-calculated output value. The information associated with the table model cell comprises the slope of the solution for the output values in the table model cell.

Another embodiment of the present invention provides an apparatus for simulating a circuit. The apparatus includes: means for determining a table model cell corresponding to a set of input values of a device in a circuit; means for determining a hash value for the set of table model vertex values associated with a table model cell; and, if a table model cache entry associated with the hash value includes values matching the table model vertex values, then responsive means for retrieving previously calculated output values corresponding to the table model cache entry, and responsive means for calculating output values for the device using the previously calculated output values corresponding to the table model cache entry and information associated with the table model cell.

An Example Computing and Network Environment

As shown above, the present invention can be implemented using a variety of computer systems and networks. An example of one such computing and network environment is described below with reference to FIGS. 6 and 7.

Figure 6:
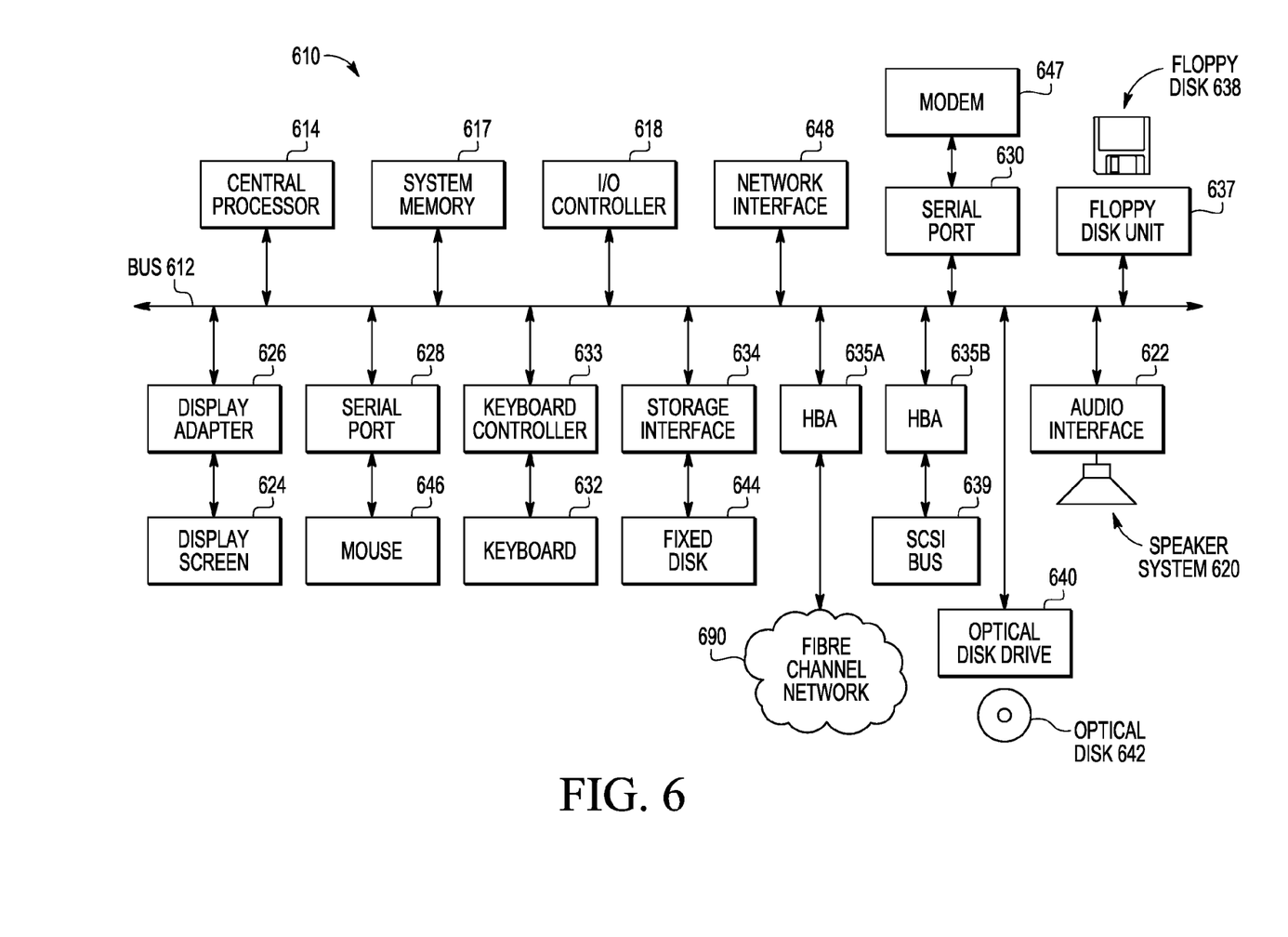
FIG. 6 is a simplified block diagram illustrating a computer system suitable for implementing aspects of the present invention.

FIG. 6 depicts a block diagram of a computer system 610 suitable for implementing aspects of the present invention. Computer system 610 includes a bus 612 which interconnects major subsystems of computer system 610, such as a central processor 614, a system memory 617 (typically RAM, but which may also include ROM, flash RAM, or the like), an input/output controller 618, an external audio device, such as a speaker system 620 via an audio output interface 622, an external device, such as a display screen 624 via display adapter 626, serial ports 628 and 630, a keyboard 632 (interfaced with a keyboard controller 633), a storage interface 634, a floppy disk drive 637 operative to receive a floppy disk 638, a host bus adapter (HBA) interface card 635A operative to connect with a Fibre Channel network 690, a host bus adapter (HBA) interface card 635B operative to connect to a SCSI bus 639, and an optical disk drive 640 operative to receive an optical disk 642. Also included are a mouse 646 (or other point-and-click device, coupled to bus 612 via serial port 628), a modem 647 (coupled to bus 612 via serial port 630), and a network interface 648 (coupled directly to bus 612).

Bus 612 allows data communication between central processor 614 and system memory 617, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS) which controls basic hardware operation such as the interaction with peripheral components. Applications resident with computer system 610 are generally stored on and accessed via a computer-readable medium, such as a hard disk drive (e.g., fixed disk 644), an optical drive (e.g., optical drive 640), a floppy disk unit 637, or other storage medium. Additionally, applications can be in the form of electronic signals modulated in accordance with the application and data communication technology when accessed via network modem 647 or network interface 648.

Storage interface 634, as with the other storage interfaces of computer system 610, can connect to a standard computer-readable medium for storage and/or retrieval of information, such as a fixed disk drive 644. Fixed disk drive 644 may be a part of computer system 610 or may be separate and accessed through other interface systems. Modem 647 may provide a direct connection to a remote server via a telephone link or to the Internet via an internet service provider (ISP). Network interface 648 may provide a direct connection to a remote server via a direct network link to the Internet via a POP (point of presence). Network interface 648 may provide such connection using wireless techniques, including digital cellular telephone connection, Cellular Digital Packet Data (CDPD) connection, digital satellite data connection or the like.

Many other devices or subsystems (not shown) may be connected in a similar manner (e.g., document scanners, digital cameras and so on). Conversely, all of the devices shown in FIG. 6 need not be present to practice the present invention. The devices and subsystems can be interconnected in different ways from that shown in FIG. 6. The operation of a computer system such as that shown in FIG. 6 is readily known in the art and is not discussed in detail in this application. Code to implement the present invention can be stored in computer-readable storage media such as one or more of system memory 617, fixed disk 644, optical disk 642, or floppy disk 638. The operating system provided on computer system 610 may be MS-DOS®, MS-WINDOWS®, OS/2®, UNIX®, Linux®, or another known operating system.

Moreover, regarding the signals described herein, those skilled in the art will recognize that a signal can be directly transmitted from a first block to a second block, or a signal can be modified (e.g., amplified, attenuated, delayed, latched, buffered, inverted, filtered, or otherwise modified) between the blocks. Although the signals of the above described embodiment are characterized as transmitted from one block to the next, other embodiments of the present invention may include modified signals in place of such directly transmitted signals as long as the informational and/or functional aspect of the signal is transmitted between blocks. To some extent, a signal input at a second block can be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

Figure 7:
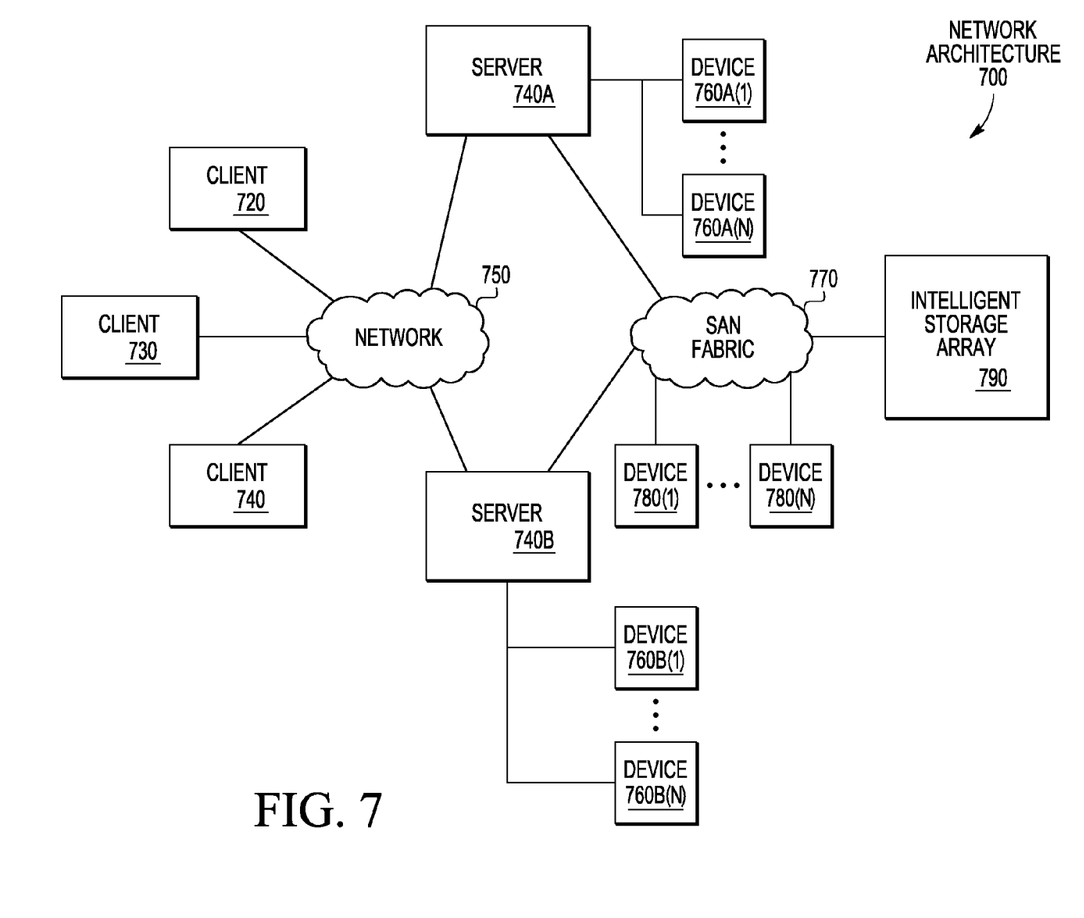
FIG. 7 is a simplified block diagram illustrating a network environment suitable for implementing aspects of the present invention.

FIG. 7 is a block diagram depicting a network architecture 700 in which client computer systems 710, 720 and 730, as well as storage servers 740A and 740B (any of which can be implemented using computer system 610), are coupled to a network 750. Storage server 740A is further depicted as having storage devices 760A(1)-(N) directly attached, and storage server 740B is depicted with storage devices 760B(1)-(N) directly attached. Storage servers 740A and 740B are also connected to a SAN fabric 770, although connection to a storage area network is not required for operation of the invention. SAN fabric 770 supports access to storage devices 780(1)-(N) by storage servers 740A and 740B, and so by client systems 710, 720 and 730 via network 750. Intelligent storage array 790 is also shown as an example of a specific storage device accessible via SAN fabric 770.

With reference to computer system 610, modem 647, network interface 648 or some other method can be used to provide connectivity from each of client computer systems 710, 720 and 730 to network 750. Client systems 710, 720 and 730 are able to access information on storage server 740A or 740B using, for example, a web browser or other client software (not shown). Such a client allows client systems 710, 720 and 730 to access data hosted by storage server 740A or 740B or one of storage devices 760A(1)-(N), 760B(1)-(N), 780(1)-(N) or intelligent storage array 790. FIG. 7 depicts the use of a network such as the Internet for exchanging data, but the present invention is not limited to the Internet or any particular network-based environment.

Other Embodiments

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

The foregoing describes embodiments including components contained within other components (e.g., the various elements shown as components of computer system 610). Such architectures are merely examples, and, in fact, many other architectures can be implemented which achieve the same functionality. In an abstract but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

The foregoing detailed description has set forth various embodiments of the present invention via the use of block diagrams, flowcharts, and examples. It will be understood by those within the art that each block diagram component, flowchart step, operation and/or component illustrated by the use of examples can be implemented, individually and/or collectively, by a wide range of hardware, software, firmware, or any combination thereof.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

The present invention has been described in the context of fully functional computer systems; however, those skilled in the art will appreciate that the present invention is capable of being distributed as a program product in a variety of forms, and that the present invention applies equally regardless of the particular type of computer-readable media used to actually carry out the distribution. Examples of computer-readable media include computer-readable storage media, as well as media storage and distribution systems developed in the future.

The above-discussed embodiments can be implemented by software modules that perform one or more tasks associated with the embodiments. The software modules discussed herein may include script, batch, or other executable files. The software modules may be stored on a machine-readable or computer-readable storage media such as magnetic floppy disks, hard disks, semiconductor memory (e.g., RAM, ROM, and flash-type media), optical discs (e.g., CD-ROMs, CD-Rs, and DVDs), or other types of memory modules. A storage device used for storing firmware or hardware modules in accordance with an embodiment of the invention can also include a semiconductor-based memory, which may be permanently, removably or remotely coupled to a microprocessor/memory system. Thus, the modules can be stored within a computer system memory to configure the computer system to perform the functions of the module. Other new and various types of computer-readable storage media may be used to store the modules discussed herein.

The above description is intended to be illustrative of the invention and should not be taken to be limiting. Other embodiments within the scope of the present invention are possible. Those skilled in the art will readily implement the steps necessary to provide the structures and the methods disclosed herein, and will understand that the process parameters and sequence of steps are given by way of example only and can be varied to achieve the desired structure as well as modifications that are within the scope of the invention. Variations and modifications of the embodiments disclosed herein can be made based on the description set forth herein, without departing from the scope of the invention.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Consequently, the invention is intended to be limited only by the scope of the appended claims, giving full cognizance to equivalents in all respects.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for simulating a circuit, the method comprising:
   determining a table model cell corresponding to a set of input values of a device in the circuit;
   determining a hash value for a set of vertex values associated with the table model cell; and
   if a model cache entry associated with the hash value comprises values matching the table model vertex values, then
      retrieving previously calculated output values corresponding to the model cache entry, and
      calculating output values for the device using the previously calculated output values corresponding to the model cache entry and information associated with the table model cell.

2. The method of claim 1 wherein said determining the table model cell comprises:
   calculating a nearest vertex value for a dimension of an n-dimensional hypercube associated with the table model, wherein the dimension corresponds to an input value of a set of input values of the device.

3. The method of claim 1 further comprising:
   determining whether the model cache entry associated with the hash value comprises values matching the table model vertex values, wherein said determining comprises
      looking up a first entry in the model cache having an index that equals the hash value,
      determining if the first entry comprises values matching the table model vertex values,
      if the first entry comprises values matching the table model vertex values, then selecting the first entry, and
      if the first entry does not comprise values matching the table model vertex values, then
         looking up one or more entries in a neighborhood of the first entry,
         determining if one of the one or more entries in the neighborhood of the first entry comprises values matching the table model vertex values, and
         if one of the one or more entries in the neighborhood of the first entry comprises values matching the table model vertex values, selecting the entry comprising the matching values.

4. The method of claim 3 wherein the neighborhood of the first entry comprises a predetermined number of entries following the first entry in the model cache.

5. The method of claim 3 wherein said looking up the one or more entries in a neighborhood of the first entry comprises:
   reading a hop-information word stored in association with the first entry, wherein the hop-information word comprises indicia of entries in the neighborhood that are associated with the index of the first entry; and
   looking up entries in the model cache that correspond to the indicia provided in the hop-information word.

6. The method of claim 1 wherein an entry of the model cache comprises table model vertex values for a device associated with the entry and an identifier of a memory location storing the previously calculated output values for the device associated with the entry.

7. The method of claim 1 further comprising:
   if no model cache entry associated with the hash value comprises values matching the table model vertex values, then
      calculating output values for the device using the set of input values,
      storing the calculated output values in association with a device identifier, and
      storing a new entry in the model cache, wherein
         the new entry comprises the table model vertex values and an identifier of the storage location of the output values, and
         the new entry is associated with the hash value.

8. The method of claim 7 wherein said storing the new entry in the table model cache further comprises:
   determining if a storage entry in the model cache having a index value corresponding to the hash value for the set of table model vertex values is empty;
   if the storage entry is empty, then storing the new entry at the storage entry; and
   if the storage entry is not empty, then
      finding a closest empty entry to the entry in the model cache having the index value corresponding to the hash value,
      if the closest empty entry is in a neighborhood of the entry in the model cache having the index value corresponding to the hash value, storing the new entry at the closest empty entry, and if the closest empty entry is not in the neighborhood of the entry in the model cache having the index value corresponding to the hash value, using hopscotch hashing table management to move an empty entry to the neighborhood of the entry in the table model cache having the index value corresponding to the hash value.

9. The method of claim 1 wherein said calculating the output values for the device using the previously calculated output values corresponding to the model cache entry and information associated with the table model cell comprises:
  extrapolating the output values for the device from the previously calculated output values corresponding to the table model cache entry.

10. The method of claim 9 wherein said extrapolating comprises:
  calculating a difference between an input value of the device from the set of input values and a corresponding input value from a previously-evaluated device corresponding to the previously-calculated output values; and
  multiplying the difference by a slope of the solution for the output value in the table model cell and adding the result to the previously calculated output value,
    wherein the information associated with the table model cell comprises the slope of the solution for the output value in the table model cell.

11. A circuit simulation system comprising:
  an input module configured to receive a description of a circuit for simulation;
  a first memory storing a model cache comprising one or more entries;
  a second memory storing output values corresponding to the one or more entries;
  an analysis engine configured to
    determine a table model cell corresponding to a set of input values of a device, wherein the input module provides information regarding the device from the description of the circuit,
    determine a hash value for a set of table model vertex values associated with the table model cell, and
    if a model cache entry associated with the hash value stored in the table model cache comprises values matching the table model vertex values, then the analysis engine is further configured to
      read previously calculated output values corresponding to the model cache entry from the second memory, and
      calculate output values for the device using the previously calculated output values corresponding to the model cache entry and information associated with the table model cell.

12. The circuit simulation system of claim 11 wherein the analysis engine is configured to determine the table model cell for a set of input values of a device by being further configured to calculate a nearest vertex value for a dimension of an n-dimensional array associated with the table model, wherein the dimension corresponds to an input value of the set of input values of the device.

13. The circuit simulation system of claim 11 wherein the analysis engine is further configured to:
  determine whether a model cache entry associated with the hash value comprises values matching the table model vertex values by being further configured to
    look up a first entry in the model cache having an index that equals the hash value,
    determine if the first entry comprises values matching the table model vertex values,
    if the first entry comprises values matching the table model vertex values, select the first entry, and
    if the first entry does not comprise values matching the table model vertex values, then
      look up one or more entries in a neighborhood of the first entry,
      determine if one of the one or more entries in the neighborhood of the first entry comprises values matching the table model vertex values, and
      if one of the one or more entries in the neighborhood of the first entry comprises values matching the table model vertex values, select the entry comprising the matching values.

14. The circuit simulation system of claim 11 wherein the analysis engine is further configured to:
  if no entry stored in the model cache associated with the hash value comprises values matching the table model vertex values, then the analysis engine is further configured to
    calculate output values for the device using the set of input values,
    store the calculated output values in association with a device identifier in the second memory, and
    store a new entry in the model cache in the first memory, wherein
      the new entry comprises the table model vertex values and an identifier of the storage location of the output values, and
      the new entry is associated with the hash value.

15. The circuit simulation system of claim 14 wherein the analysis engine calculates the output values for the device using the set of input values by being further configured to:
  determine if each table model vertex value and nearest neighbor vertex values exists in a vertex table;
  calculate any missing table model vertex values and missing nearest neighbor vertex values;
  store the calculated table model vertex values and nearest neighbor vertex values in the vertex table; and
  calculate the output values using a simplicial interpolation on the table model vertex values.

16. The circuit simulation system of claim 15 wherein the analysis engine is further configured to:
  store the calculated output values in the second memory; and
  store a corresponding model cache entry in the first memory.

17. The circuit simulation system of claim 16 further comprising:
  a third memory storing a temporal cache, corresponding to the device, and comprising one or more entries; and
  the analysis engine is further configured to:
    store the calculated output values in an entry of the third memory associated with the hash value,
    for a subsequent set of input values of the device,
      determine a second hash value for a second set of table model vertex values for a second table model cell corresponding to the subsequent set of input values of the device, and
      if the second hash value matches the hash value, read the calculated output values stored in the entry of the third memory and calculate subsequent output values using the calculated output values.

18. The circuit simulation system of claim 14 wherein the analysis engine stores the new entry in the model cache by being further configured to:

determine if a storage entry in the table model cache having a index value corresponding to the hash value for the set of table model vertex values is empty;

if the storage entry is empty, then store the new entry at the storage entry; and if the storage entry is not empty, then find a closest empty entry to the entry in the table model cache having the index value corresponding to the hash value, if the closest empty entry is in a neighborhood of the entry in the table model cache having the index value corresponding to the hash value, store the new entry at the closest empty entry, and if the closest empty entry is not in the neighborhood of the entry in the table model cache having the index value corresponding to the hash value, use hopscotch hashing table management to move an empty entry to the neighborhood of the entry in the table model cache having the index value corresponding to the hash value.

19. The circuit simulation system of claim 11 wherein the analysis engine calculates the output values for the device using the previously calculated output values corresponding to the entry by being configured to:

extrapolate the output values for the device from the previously calculated output values corresponding to the table model cache entry, wherein said extrapolating comprises calculating a difference between an input value of the device from the set of input values and a corresponding input value from a previously evaluated device corresponding to the previously calculated output values; and multiplying the difference by a slope of the solution for the output value in the table model cell and adding the result to the previously calculated output value, wherein the information associated with the table model cell comprises the slope of the solution for the output value in the table model cell.

20. An apparatus for simulating a circuit, the apparatus comprising:

means for determining a table model cell corresponding to a set of input values of a device in the circuit;

means for determining a hash value for the set of table model vertex values associated with the table model cell; and if a table model cache entry associated with the hash value comprises values matching the table model vertex values, then means for retrieving previously calculated output values corresponding to the table model cache entry, and means for calculating output values for the device using the previously calculated output values corresponding to the table model cache entry and information associated with the table model cell.

\* \* \* \* \*